United States Patent
Park et al.

(10) Patent No.: US 8,446,785 B2
(45) Date of Patent: May 21, 2013

(54) LATENCY CONTROL CIRCUIT, LATENCY CONTROL METHOD THEREOF, AND SEMICONDUCTOR MEMORY DEVICE INCLUDING THE SAME

(75) Inventors: Min-Su Park, Gyeonggi-do (KR); Jae-Il Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 74 days.

(21) Appl. No.: 13/207,979

(22) Filed: Aug. 11, 2011

(65) Prior Publication Data
US 2012/0269016 A1    Oct. 25, 2012

(30) Foreign Application Priority Data
Apr. 21, 2011   (KR) .................. 10-2011-0037366

(51) Int. Cl.
*G11C 7/00*    (2006.01)
(52) U.S. Cl.
USPC .................. 365/194; 365/191; 365/233.1
(58) Field of Classification Search
USPC ............................. 365/191, 233.1
See application file for complete search history.

(56) References Cited

U.S. PATENT DOCUMENTS

| | | | | |
|---|---|---|---|---|
| 7,656,745 B2* | 2/2010 | Kwak | | 365/233.1 |
| 7,881,132 B2* | 2/2011 | Shin | | 365/194 |
| 7,944,772 B2* | 5/2011 | Ahn et al. | | 365/233.1 |
| 8,018,791 B2* | 9/2011 | Kwak | | 365/233.1 |
| 8,144,530 B2* | 3/2012 | Kim et al. | | 365/194 |

FOREIGN PATENT DOCUMENTS

| KR | 1020050074247 | 7/2005 |
|---|---|---|
| KR | 101004665 | 1/2011 |

OTHER PUBLICATIONS

Notice of Allowance issued by the Korean Intellectual Property Office on Jan. 24, 2013.

* cited by examiner

*Primary Examiner* — Pho M Luu
(74) *Attorney, Agent, or Firm* — IP & T Group LLP

(57) ABSTRACT

A latency control circuit of a semiconductor device includes a phase detection unit configured to generate phase information regarding a phase difference between an external clock and an internal clock, a delay amount deciding unit configured to decide a latency delay amount based on path information of an input signal, a latency value of the input signal, and the phase information, and a latency delay unit configured to generate a latency signal by delaying the input signal according to the latency delay amount and the phase information to produce a delayed input signal and by synchronizing the delayed input signal with the internal clock.

33 Claims, 7 Drawing Sheets

LATENCY CONTROL CIRCUIT, LATENCY CONTROL METHOD THEREOF, AND SEMICONDUCTOR MEMORY DEVICE INCLUDING THE SAME

CROSS-REFERENCE TO RELATED APPLICATIONS

The present application claims priority of Korean Patent Application No. 10-2011-0037366, filed on Apr. 21, 2011, which is incorporated herein by reference in its entirety.

BACKGROUND

1. Field of the Invention

Exemplary embodiments of the present invention relate to a latency control circuit, a latency control method thereof, and a semiconductor memory device including the latency control circuit.

2. Description of the Related Art

Semiconductor devices inside of a system operate by exchanging signals and data with each other. For example, a semiconductor memory device, such as Dynamic Random Access Memory (DRAM) device, outputs a stored data and transfers the data to a controller of the system, after the controller applies a read command to the semiconductor memory device. However, the semiconductor memory device cannot output the data instantly at the moment when the semiconductor memory device receives the read command because it takes some time to call the data out of the semiconductor memory device and output the data through an array process.

In order to implement semiconductor devices, it is desirable to define the waiting time from the moment when a particular signal is applied to a semiconductor device to the moment when an operation corresponding to the signal. This defined time is called latency. For example, the time taken from the moment when a read command is applied to a DRAM device to the moment when a data is actually outputted from the DRAM device is referred to as CAS latency (CL). If the CAS latency is 5 clock cycles (1 tCK=one clock cycle), a corresponding data should be outputted through a DQ pad of the DRAM device exactly 5 clock cycles after a read command is applied to an input pad of the DRAM device. A latency control circuit functions to control a delay amount of an input signal so that an operation, corresponding to a signal applied to a semiconductor device, can be performed at an exact timing in compliance with the latency of the signal.

A latency control circuit is generally used along with a Delay Locked Loop (DLL). A delay locked loop is a circuit for synchronizing a clock used in a system and a semiconductor device. For example, a semiconductor device, such as Double Data Rate Synchronous DRAM (DDR SDRAM) device, may transfer diverse signals and data by using an internal clock having the same frequency as the frequency of an external clock used in an external system. Herein, the clock inputted to the semiconductor device is applied at first in the state that the clock is synchronized with the external clock, but the clock is delayed as it passes through several constituent elements inside the semiconductor device, and therefore, the clock may not be synchronized with the external clock by the time the clock is outputted to the outside. Therefore, for stable transfer of a signal and a data, the internal clock should be reversely compensated for the delay amount caused in a signal transfer path. For this purpose a delay locked loop (DLL) is used such that the outputted internal clock and the external clock are synchronized in an external system.

FIG. 1 is a block view of a known semiconductor device including a latency control circuit.

Referring to FIG. 1, the known semiconductor device includes a latency control unit 101, a latency delay unit 103, and a delay locked loop unit 105.

The delay locked loop unit 105 generates an internal clock DLLCLK by delaying an external clock EXTCLK inputted to the semiconductor device. The delay amount of the delay locked loop unit 105 is controlled to make the internal clock DLLCLK have the same phase as the external clock EXT-CLK when the internal clock DLLCLK is outputted to the outside through an internal path of the semiconductor device.

The latency control unit 101 decides a latency delay amount LSHIFT by using the external clock EXTCLK and the internal clock DLLCLK when a delay amount reset signal OERST is enabled. For example, when it is assumed that the latency between an input signal INPUT and an A operation in a target circuit (not shown) corresponding to the input signal INPUT is N clock cycles (N tCK), the target circuit performs the A operation in N clock cycles from the moment when the input signal INPUT is applied to the semiconductor device based on the external clock EXTCLK. Therefore, the input signal INPUT should arrive at the target circuit at an exact timing in compliance with the latency, and the latency control unit 101 controls the latency delay amount LSHIFT to delay the input signal INPUT as much as the given latency.

FIG. 2 is a timing diagram illustrating the operation of the latency delay unit 103. When it is assumed that the latency delay amount LSHIFT decided in the latency control unit 101 is two clock cycles (2 tCK), as illustrated in FIG. 2, the latency delay unit 103 generates a latency signal LATC by delaying the input signal INPUT synchronized with the external clock EXTCLK for two clock cycles based on the external clock EXTCLK and synchronizing the delayed input signal with the internal clock DLLCLK. Herein, the operation of synchronizing a signal with different clocks is referred to as domain crossing. The internal clock DLLCLK is generated to have the same phase as the phase of the external clock EXT-CLK at the moment when the internal clock DLLCLK arrives at the target circuit. Therefore, the latency signal LATC synchronized with the internal clock DLLCLK can arrive at the target circuit at the exact moment in compliance with the latency based on the external clock EXTCLK.

In the known latency control circuit, however, diverse variables may occur in the delay path of the input signal INPUT according to variation in the process, voltage, and/or temperature (PVT) conditions of the semiconductor device. In particular, when the phase of the external clock EXTCLK and the phase of the internal clock DLLCLK slightly differ from each other, the possibility for failure occurring in the domain crossing is increased. FIGS. 3A and 3B illustrate this concern.

FIG. 3A is an operation timing diagram of the latency delay unit 103 when the phase of the external clock EXTCLK is slightly ahead of the phase of the internal clock DLLCLK.

Referring to FIG. 3A, when the input signal INPUT is delayed more than the latency delay amount LSHIFT due to a change in the PVT conditions of the semiconductor device, a delayed input signal INPUT_DL is synchronized with the internal clock DLLCLK at a moment one clock cycle behind the moment it is supposed to be synchronized in the normal case (i.e., where a pass occurs). Therefore, a failure occurs because the latency signal LATC is enabled one clock cycle later than the given latency.

FIG. 3B is an operation timing diagram of the latency delay unit 103 when the phase of the internal clock DLLCLK is slightly ahead of the phase of the external clock EXTCLK.

Referring to FIG. 3B, when the input signal INPUT is delayed less than the latency delay amount LSHIFT due to a change in the PVT conditions of the semiconductor device, the delayed input signal INPUT_DL is synchronized with the internal clock DLLCLK at a moment one clock cycle earlier than the moment it is supposed to be synchronized in the normal case (i.e., where a pass occurs). Therefore, a failure occurs because the latency signal LATC is enabled one clock cycle faster than the given latency.

SUMMARY

Exemplary embodiments of the present invention are directed to a latency control circuit which may generate a latency signal at an exact moment regardless of the phase difference between an external clock and an internal clock, even though there is a change in the process, voltage and/or temperature (PVT) conditions of a semiconductor device, a latency control method thereof, and a semiconductor memory device including the latency control circuit.

In accordance with an exemplary embodiment of the present invention, a latency control circuit of a semiconductor device includes a phase detection unit configured to generate phase information regarding a phase difference between an external clock and an internal clock, a delay amount deciding unit configured to decide a latency delay amount based on path information of an input signal, a latency value of the input signal, and the phase information, and a latency delay unit configured to generate a latency signal by delaying the input signal according to the latency delay amount and the phase information to produce a delayed input signal and by synchronizing the delayed input signal with the internal clock.

In accordance with another exemplary embodiment of the present invention, a semiconductor memory device includes a delay locked loop unit configured to generate an internal clock by delaying an external clock, a phase detection unit configured to generate phase information regarding a phase difference between the external clock and the internal clock, a delay amount deciding unit configured to decide a latency delay amount based on path information of an input signal, a latency value of the input signal, and the phase information, a latency delay unit configured to generate a latency signal by delaying the input signal according to the latency delay amount and the phase information to produce a delayed input signal and by synchronizing the delayed input signal with the internal clock, and a data input/output unit configured to perform a data input/output operation in response to the latency signal.

The path information may have a value representing a delay amount of the input signal until the input signal is transferred to the data input/output unit.

The phase information may include a first phase signal and a second phase signal, and the phase detection unit may enable the first phase signal when the external clock leads the internal clock within a first threshold value, and enable the second phase signal when the internal clock leads the external clock within a second threshold value.

When the first phase signal is enabled, the delay amount deciding unit may decide the latency delay amount by subtracting the sum of the value of the path information and one from the latency value (i.e., latency delay amount=path information+1), and the latency delay unit may generate the latency signal by delaying the input signal by the latency delay amount and a first delay amount to produce the delayed input signal and by synchronizing the delayed input signal with the internal clock.

When the second phase signal is enabled, the delay amount deciding unit may decide the latency delay amount by subtracting the path information from the latency value, and the latency delay unit may generate the latency signal by delaying the input signal by the latency delay amount and a second delay amount to produce the delayed input signal and by synchronizing the delayed input signal with the internal clock.

The delay amount deciding unit may include a path information generator for generating the path information in response to a delay amount reset signal which is inputted in synchronization with the external clock, and a calculator for receiving the latency value, the path information, and the phase information, and deciding the latency delay amount.

In accordance with yet another exemplary embodiment of the present invention, a method for controlling a latency includes generating path information of a semiconductor device in response to a delay amount reset signal, generating phase information regarding a phase difference between an external clock and an internal clock, deciding a latency delay amount based on a latency value of an input signal, the path information, and the phase information, delaying the input signal according to the latency delay amount and the phase information to produce a delayed input signal, and generating a latency signal by synchronizing the delayed input signal with the internal clock.

DETAILED DESCRIPTION

Figure 1:
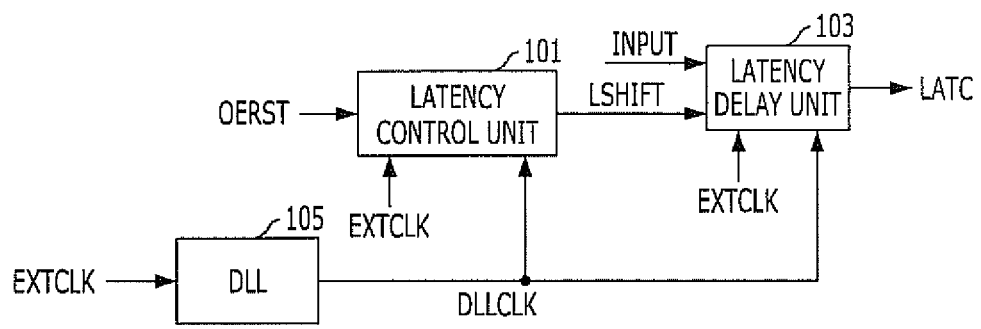
FIG. 1 is a block view of a known semiconductor device including a latency control circuit.
Figure 2:
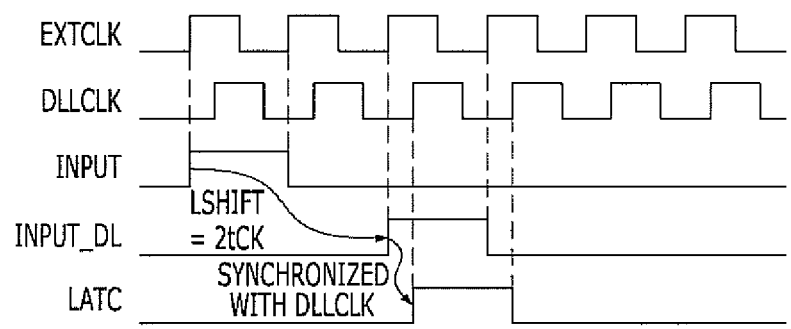
FIG. 2 is a timing diagram illustrating the operation of a latency delay unit 103 shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
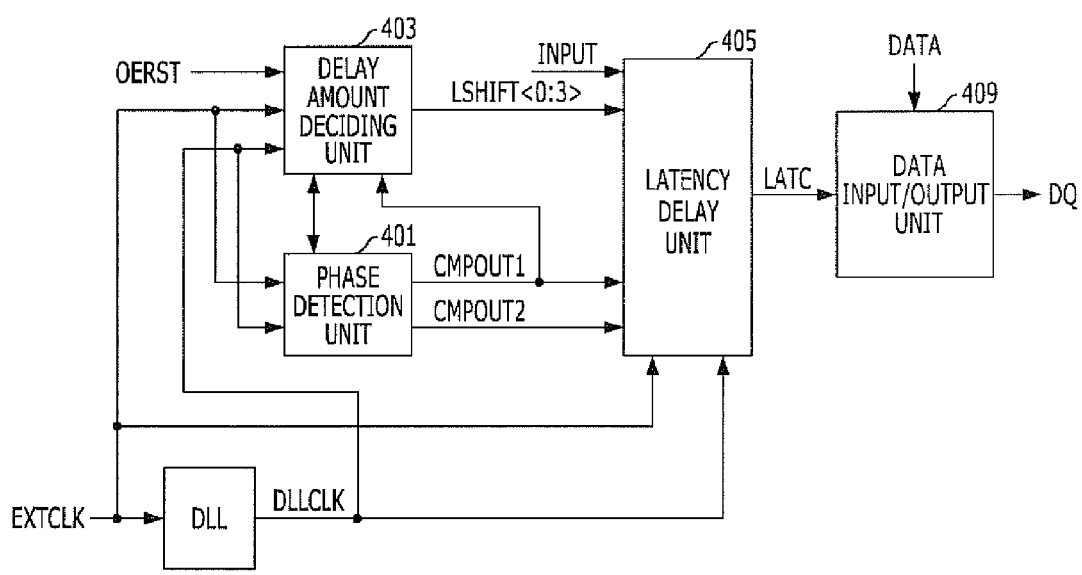
FIG. 4 is a latency control circuit of a semiconductor device in accordance with an exemplary embodiment of the present invention.

FIG. 4 is a latency control circuit of a semiconductor device in accordance with an exemplary embodiment of the present invention.

Referring to FIG. 4, the latency control circuit includes a phase detection unit 401, a delay amount deciding unit 403, and a latency delay unit 405. The phase detection unit 401 senses whether the phase difference between an external clock EXTCLK and an internal clock DLLCLK which have the same clock frequency is within a certain value and generates phase information. The certain value may be a predetermined value set by the designer of the phase detection unit at the time of initial fabrication or afterwards. The delay amount deciding unit 403 decides a latency delay amount LSHIFT<0:3> based on phase information of an input signal INPUT, a latency value of the input signal INPUT, and the phase information generated in the phase detection unit 401. The latency delay unit 405 delays the input signal INPUT by the latency delay amount LSHIFT<0:3> and a delay amount corresponding to the phase information, and generates a latency signal LATC in synchronization with the internal clock DLLCLK.

Herein, the internal clock DLLCLK is generated in a delay locked loop unit 407 inside of the semiconductor device by delaying the received external clock EXTCLK.

The delay amount deciding unit 403 obtains a delay amount of a path through which the input signal INPUT is to pass inside of the semiconductor device and generates path information by quantizing the delay amount on the basis of a clock. Herein, the delay amount of a path through which the input signal INPUT is to pass inside of the semiconductor device is a sum of a delay amount that the input signal INPUT has until the input signal INPUT is applied to the semiconductor device and inputted to the latency delay unit 405 plus a delay amount that the latency signal LATC generated in the latency delay unit 405 is transferred to a target circuit (not shown) in response to the input signal INPUT. Herein, the target circuit refers to a circuit device where an operation corresponding to the input signal INPUT is actually performed inside of the semiconductor device.

Figure 3A:
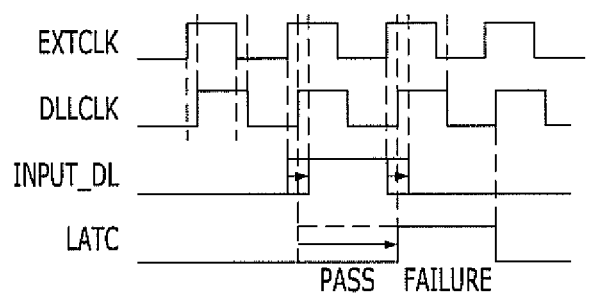
FIG. 3A is an operation timing diagram of the latency delay unit 103 shown in FIG. 2 when the phase of the external clock EXTCLK is slightly ahead of the phase of the internal clock DLLCLK.
Figure 3B:
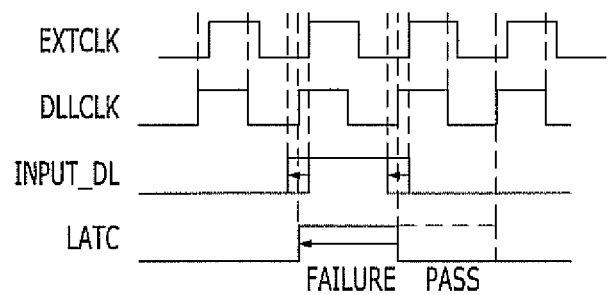
FIG. 3B is an operation timing diagram of the latency delay unit 103 shown in FIG. 2 when the phase of the internal clock DLLCLK is slightly ahead of the phase of the external clock EXTCLK.

The phase detection unit 401 senses the phase difference between an external clock EXTCLK and an internal clock DLLCLK and generates phase information. The phase information includes a first phase signal CMPOUT1 and a second phase signal CMPOUT2. As illustrated in FIGS. 3A and 3B, when there is a slight difference between the external clock EXTCLK and the internal clock DLLCLK, the latency signal LATC may be generated one clock cycle earlier or later than a normal timing due to a change in the process, voltage, and/or temperature (PVT) conditions of the semiconductor device. To address this concern, the delay amount of the latency delay unit 405 is controlled in consideration of the phase difference between the external clock EXTCLK and the internal clock DLLCLK along with the path information of the input signal INPUT.

To be specific, when the external clock EXTCLK leads the internal clock DLLCLK within a first threshold value, the phase detection unit 401 enables a first phase signal CMPOUT1, while a second phase signal CMPOUT2 remains in a disabled state. When the first phase signal CMPOUT1 is enabled, the delay amount deciding unit 403 generates the latency delay amount LSHIFT<0:3> by subtracting the path information from the latency value of the input signal INPUT and then further subtracting one clock cycle (1 tCK). Subsequently, the latency delay unit 405 generates the latency signal LATC by delaying the input signal INPUT by the latency delay amount LSHIFT<0:3>, further delaying the delayed signal by a first delay amount, and synchronizing the further delayed signal with the internal clock DLLCLK. Here, it is assumed that the input signal INPUT is synchronized with the external clock EXTCLK.

Also, when the internal clock DLLCLK leads the external clock EXTCLK within a second threshold value, the phase detection unit 401 enables the second phase signal CMPOUT2, while the first phase signal CMPOUT1 remains in a disabled state. When the second phase signal CMPOUT2 is enabled, the delay amount deciding unit 403 generates the latency delay amount LSHIFT<0:3> by subtracting the path information from the latency value of the input signal INPUT. Subsequently, the latency delay unit 405 generates the latency signal LATC by delaying the input signal INPUT by the latency delay amount LSHIFT<0:3>, further delaying the delayed signal by a second delay amount, and synchronizing the further delayed signal with the internal clock DLLCLK. Again, it is assumed that the input signal INPUT is synchronized with the external clock EXTCLK.

Herein, it is assumed that the first delay amount is the same as the first threshold value and the second delay amount is the same as the second threshold value. However, the first delay amount may be the same or greater than the first threshold value, and the second delay amount may be the same or greater than the second threshold value. The first threshold value and the second threshold value may be arbitrarily set during the designing of the circuit in consideration of diverse factors, such as a clock frequency and PVT conditions.

When the phase difference between the external clock EXTCLK and the internal clock DLLCLK is more than the first threshold value or the second threshold value, both the first phase signal CMPOUT1 and the second phase signal CMPOUT2 are disabled and the latency signal LATC is generated according to a known method. In other words, the delay amount deciding unit 403 generates the latency delay amount LSHIFT<0:3> by subtracting the path information from the latency value of the input signal INPUT, and the latency delay unit 405 generates the latency signal LATC by delaying the input signal INPUT by the latency delay amount LSHIFT<0:3> and synchronizing the delayed signal with the internal clock DLLCLK.

A data input/output unit 409 performs a data input/output operation of outputting a data DATA to a data pad DQ in response to the latency signal LATC.

Figure 5:
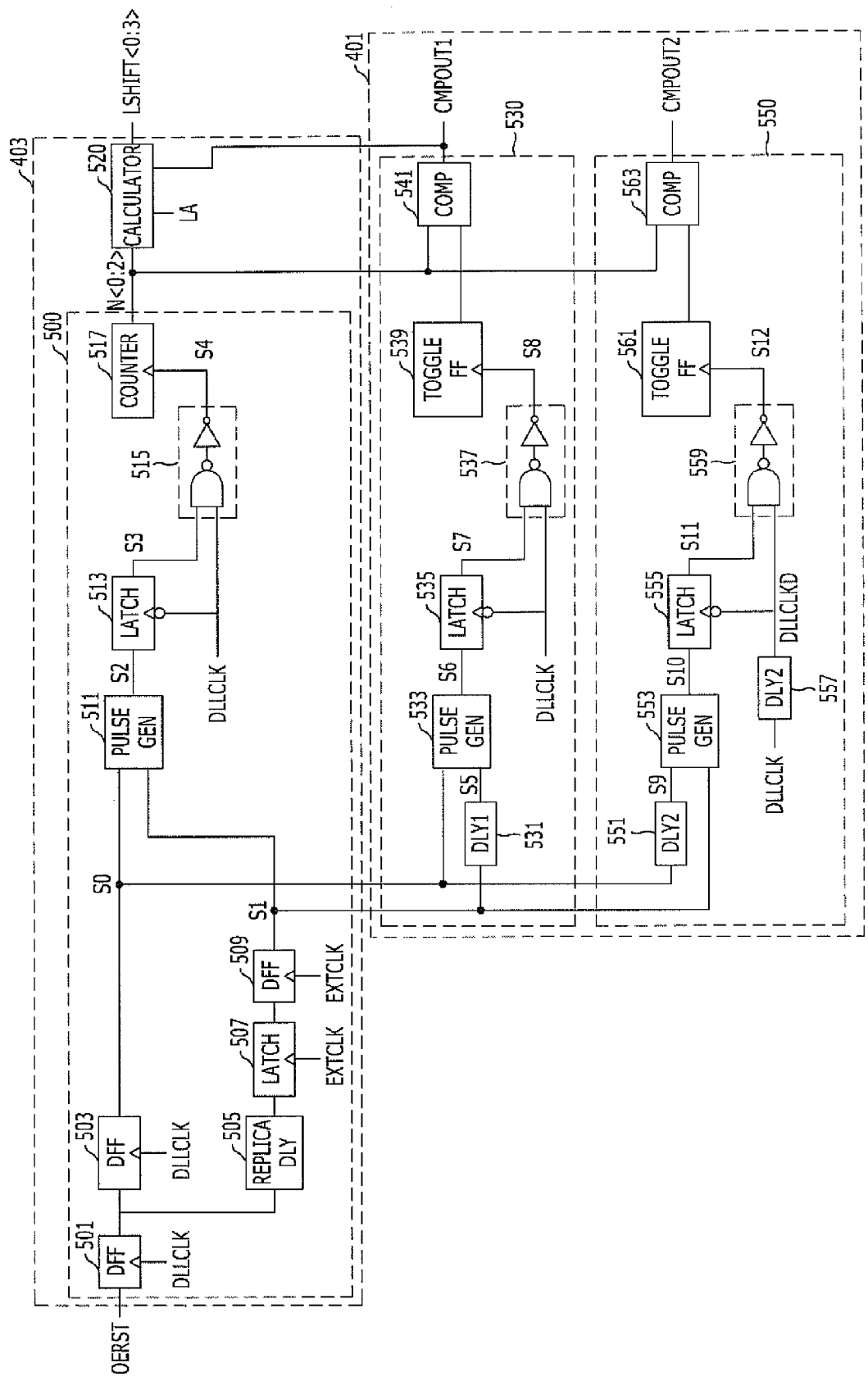
FIG. 5 is a block view illustrating a phase detection unit 401 and a delay amount deciding unit 403 shown in FIG. 4.
Figure 6:
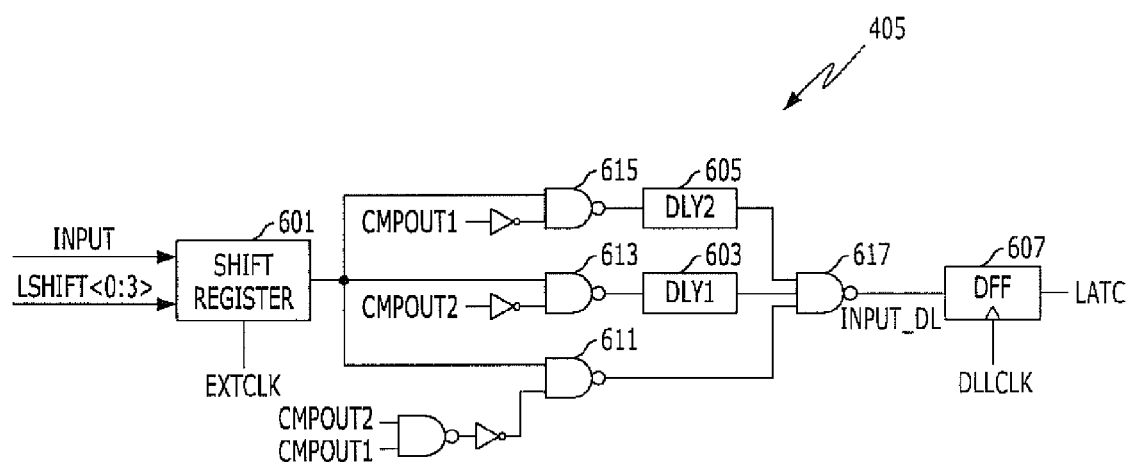
FIG. 6 is a block view illustrating a latency delay unit 405 shown in FIG. 4.

FIG. 5 is a block view illustrating the phase detection unit 401 and the delay amount deciding unit 403 shown in FIG. 4, and FIG. 6 is a block view illustrating the latency delay unit 405 shown in FIG. 4.

Referring to FIG. 5, the delay amount deciding unit 403 includes a path information generator 500 and a calculator 520. The path information generator 500 may generate path information N<0:2> in response to a delay amount reset signal OERST which is inputted in synchronization with the external clock EXTCLK. The calculator 520 decides the latency delay amount LSHIFT<0:3> based on the generated path information N<0:2>, the latency value LA of the input signal INPUT, and phase information. Here, as shown in FIG. 5, the phase information may be, for example, the first phase signal CMPOUT1, which is generated in the phase detection unit 401.

Still referring to FIG. 5, the phase detection unit 401 may include a first detector 530 for generating the first phase signal CMPOUT1 and a second detector 550 for generating the second phase signal CMPOUT2.

Referring to FIG. 6, the latency delay unit 405 may include a shift register 601, first and second delayers 603 and 605, and a D-flip-flop 607. The shift register 601 delays the input signal INPUT by the latency delay amount LSHIFT<0:3> based on the external clock EXTCLK. The first and second delayers 603 and 605 have first and second delay amounts DLY1 and DLY2 corresponding to the first and second phase signals CMPOUT1 and CMPOUT2, respectively. The D-flip-flop 607 generates the latency signal LATC by synchronizing a delayed input signal INPUT_DL with the internal clock DLLCLK.

Hereafter, the operations of the phase detection unit 401, the delay amount deciding unit 403, and the latency delay unit 405 are described in more detail with reference to FIGS. 7 to 10.

Figure 7:
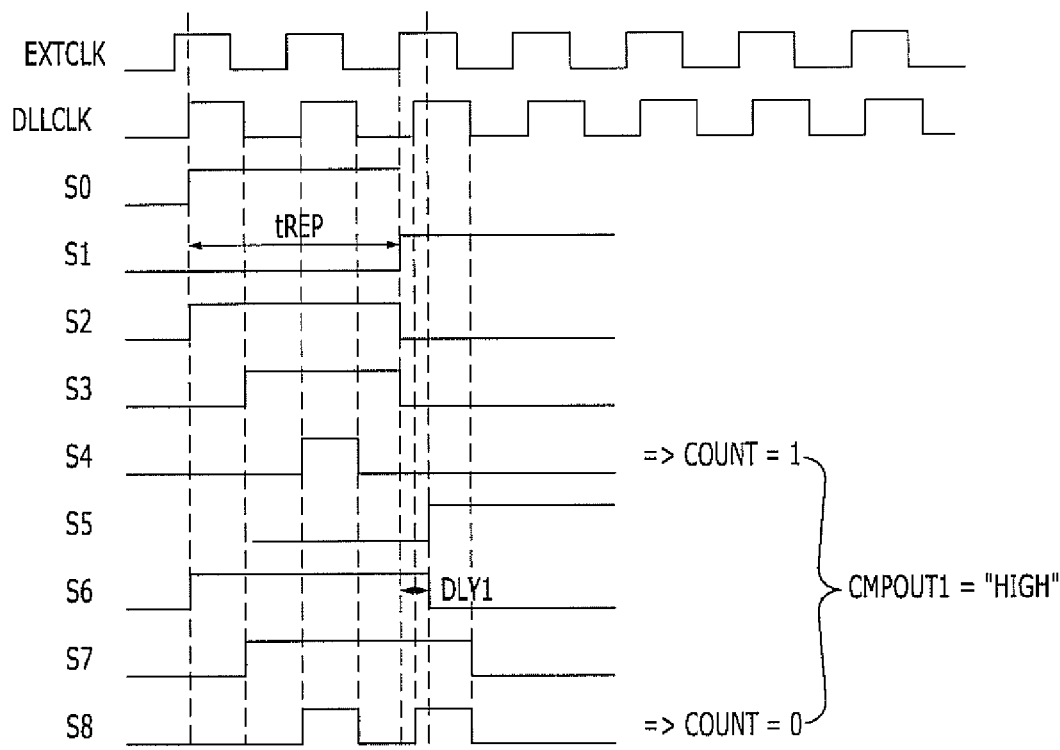
FIGS. 7 and 8 are operation timing diagrams of a case when an external clock EXTCLK leads an internal clock DLLCLK within a first threshold value.
Figure 8:
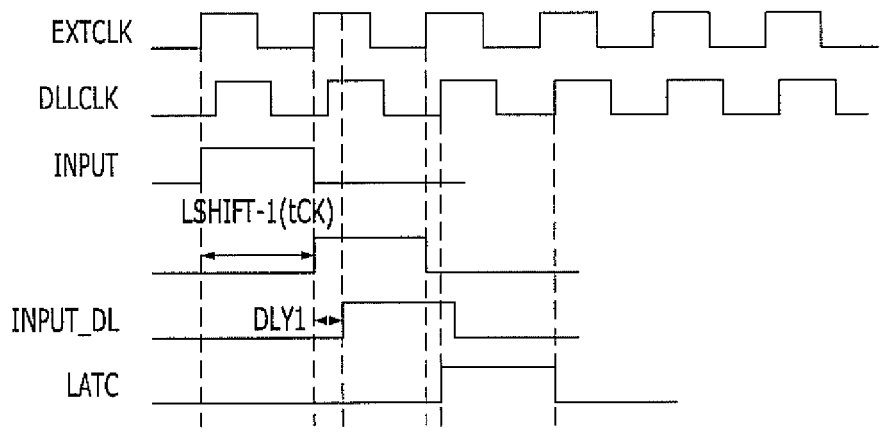

FIGS. 7 and 8 are operation timing diagrams of a case when an external clock EXTCLK leads an internal clock DLLCLK within a first threshold value.

First, looking at the process of generating the path information N<0:2> of the path information generator 500, the delay amount reset signal OERST synchronized with the external clock EXTCLK becomes a zeroth signal S0 synchronized with the internal clock DLLCLK after passing through D-flip-flops 501 and 503 and becomes a first signal S1 synchronized with the external clock EXTCLK after passing through the D-flip-flop 501, a replica delayer 505, a latch 507, and a D-flip-flop 509. Herein, a replica delay amount tREP of the replica delayer 505 is models the same value as the delay amount of a path through which the input signal INPUT passes inside of the semiconductor device.

The zeroth signal S0 and the first signal S1 are inputted to a pulse generator 511, and the pulse generator 511 generates a second signal S2 which is enabled to a logic high level from a moment when the zeroth signal S0 is enabled to a logic high level to a moment when the first signal S1 is enabled to a logic high level. Therefore, the time that the second signal S2 is enabled to a logic high level becomes the same as the replica delay amount tREP.

A latch 513 generates a third signal S3 by latching the second signal S2 when the internal clock DLLCLK is in a logic low level. Further, logic gates 15 perform a logical operation to combine the third signal S3 and the internal clock DLLCLK to generate a fourth signal S4. For example, the logic gates 15 may include a NAND gate and an inverter, so that the fourth signal S4 is enabled to a logic high level when both the third signal S3 and the internal clock DLLCLK are in the logic high level.

A counter 517 generates the path information N<0:2> by counting the number of times that the fourth signal S4 toggles. Therefore, the path information N<0:2> is an integer number, which represents the delay amount of the path through which the input signal INPUT passes inside of the semiconductor device. For example, in FIG. 7, since the fourth signal S4 toggles one time, the value of the path information N<0:2> is 1.

Next, looking at the process of generating the first phase signal CMPOUT1 in the first detector 530, a delayer 531 generates a fifth signal S5 by delaying the first signal S1 by the first delay amount DLY1. Then, a pulse generator 533 generates a sixth signal S6 that is enabled to a logic high level from a moment when the zeroth signal S0 is enabled to a logic high level to a moment that the fifth signal S5 is enabled to a logic high level. Herein, it is assumed that the first delay amount DLY1 is the same as the first threshold value.

A latch 535 generates a seventh signal S7 by latching the sixth signal S6 when the internal clock DLLCLK is in a logic low state. Further, logic gates 537 perform a logical operation to combine the seventh signal S7 and the internal clock DLLCLK to generate an eighth signal S8. For example, the logic gates 537 may include a NAND gate and an inverter, so that the eighth signal S8 is enabled to a logic high level when both the seventh signal S7 and the internal clock DLLCLK are in a logic high level. Therefore, when the external clock EXTCLK leads the internal clock DLLCLK within the first threshold value, the eighth signal S8 toggles one more time than the fourth signal S4. In other words, since the sixth signal S6 is generated by delaying the first signal S1 by the first delay amount DLY1 which is the same as the first threshold value, the sixth signal S6 is latched to output the seventh signal S7 in the next logic low duration after passing through the logic low duration of the internal clock DLLCLK in which the second signal S2 is latched. Therefore, the seventh signal S7 maintains the logic high state at least more than a half clock cycle longer than the third signal S3. As a result, the eighth signal S8 toggles twice.

A flip-flop 539 transitions an output from a logic low level to a logic high level or from a logic high level to a logic low level whenever the eighth signal S8 toggles. A comparator 541 compares the output of the flip-flop 539 with the first bit N<0> (e.g., the least significant bit) of the path information N<0:2>, and when the two values are different, it enables the first phase signal CMPOUT1 to a logic high level. Alternatively, when the two values are the same, the comparator 541 keeps the first phase signal CMPOUT1 at a logic low level. Therefore, in the case of FIG. 7, since the value of the path information N<0:2> is 1, the least significant bit N<0> of the path information N<0:2> is in a logic high level, and since the output of the flip-flop 539 becomes a logic low level, the first phase signal CMPOUT1 is enabled to a logic high level. Here, the second phase signal CMPOUT2 is disabled to a logic low level.

Additionally, when the first phase signal CMPOUT1 is enabled to a logic high level, the calculator 520 of the delay amount deciding unit 403 obtains a value for the latency delay amount LSHIFT<0:3> by subtracting the path information N<0:2> from the latency value LA of the given input signal INPUT and further subtracting one.

Therefore, as shown in FIG. 8, when the actual latency delay amount LSHIFT<0:3> represents 2 clock cycles, the latency signal LATC may be generated after two clock cycles of the external clock EXTCLK by delaying the input signal INPUT by a number of clock cycles equal to one less than the value of the latency delay amount LSHIFT<0:3> (i.e., delaying the input signal INPUT by one clock cycle because 2−1=1), further delaying the delayed signal by the first delay amount DLY1, and synchronizing the resultant delayed signal to a rising edge of the internal clock DLLCLK. In this way, it is possible to prevent a failure shown in FIG. 3A from occurring.

Figure 9:
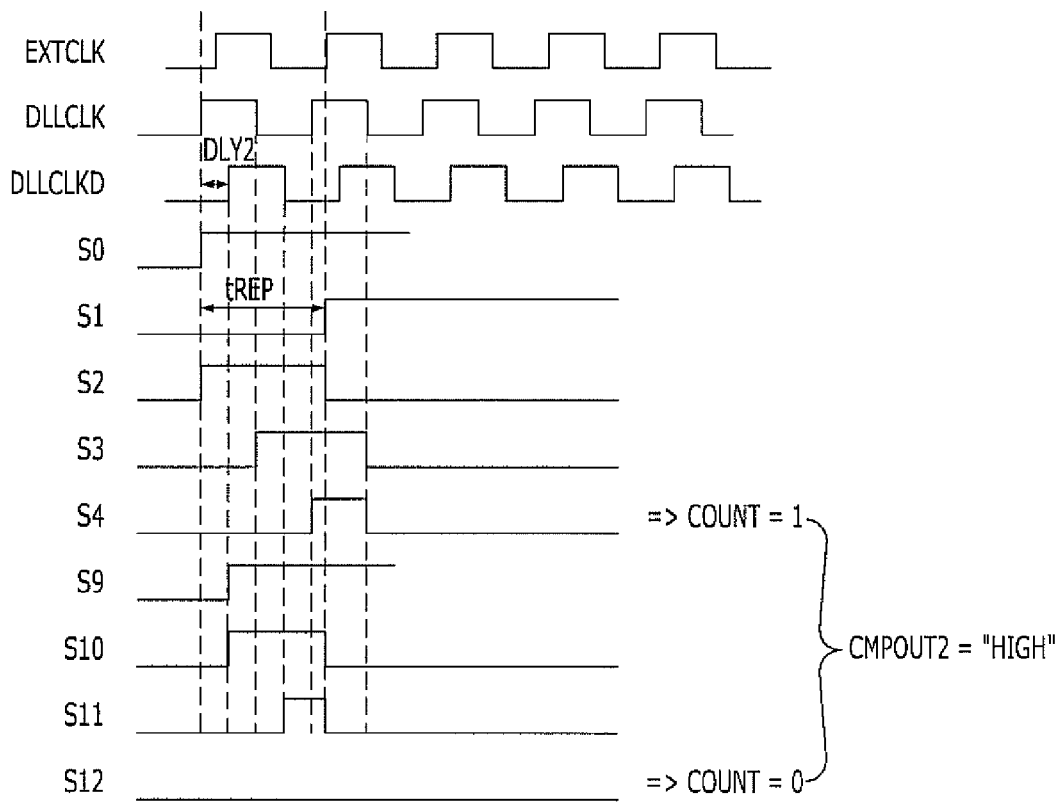
FIGS. 9 and 10 are operation timing diagrams of a case when an internal clock DLLCLK leads an external clock EXTCLK within a second threshold value.
Figure 10:
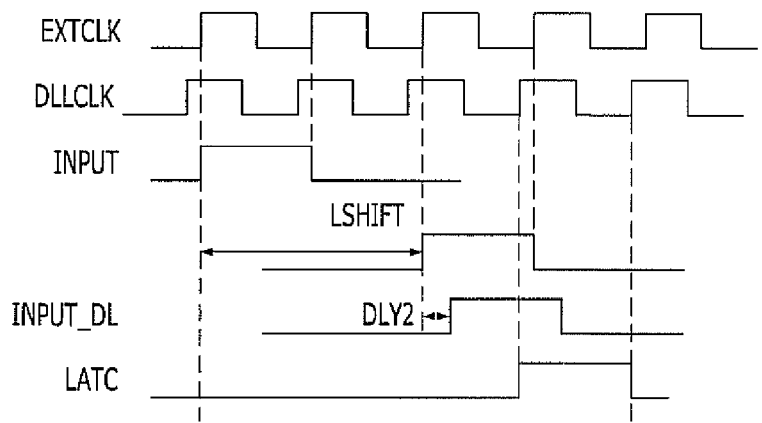

FIGS. 9 and 10 are operation timing diagrams of a case when an internal clock DLLCLK leads an external clock EXTCLK within a second threshold value.

The process of generating the zeroth signal S0 to the fourth signal S4 and the path information N<0:2> in the path information generator 500 is the same as described with reference to FIG. 7. Since the fourth signal S4 toggles once in FIG. 9, the value of the path information N<0:2> is 1.

Next, looking at the process of generating the second phase signal CMPOUT2 in the second detector 550, the zeroth signal S0 is delayed by the second delay amount DLY2 through a delayer 551 to generate a ninth signal S9. Then, a pulse generator 553 generates a tenth signal S10 which is enabled to a logic high level from a moment when the ninth signal S9 is enabled to a logic high level to a moment when the first signal S1 is enabled to a logic high level. Herein, it is assumed that the second delay amount DLY2 is the same as the second threshold value.

A delayer 557 delays the internal clock DLLCLK by the second delay amount DLY2, and a latch 555 generates an eleventh signal S11 by latching the tenth signal S10 when a delayed internal clock DLLCLKD is in a logic low state. Further, logic gates 559 perform a logical operation to combine the eleventh signal S11 and the delayed internal clock DLLCLKD to generate a twelfth signal S12. For example, the logic gates 559 may include a NAND gate and an inverter, so that the twelfth signal S12 is enabled to a logic high level, when both the eleventh signal S11 and the delayed internal clock DLLCLKD are in the logic high level. Therefore, if the internal clock DLLCLK is ahead of the external clock EXTCLK within the second threshold value, the twelfth signal S12 toggles one less time than the fourth signal S4. In the case of FIG. 9, the moment that the tenth signal S10 transitions to a logic high level is delayed from the second signal S2 by the second delay amount DLY2, and the eleventh signal S11 is generated by delaying the internal clock DLLCLK by second delay amount DLY2, which is the same as the second threshold value, to obtain the delayed internal clock DLLCLKD and latching the tenth signal S10 when the delayed internal clock DLLCLKD is in a logic low level. Thus, the duration in which the eleventh signal S11 is in a logic high level ends before the logic level of the delayed internal clock DLLCLKD turns from low to high. As a result, the duration where both the delayed internal clock DLLCLKD and the eleventh signal S11 are in a logic high level does not exist, keeping the twelfth signal S12 in the logic low level.

A flip-flop 561 transitions the output from low to high or from high to low every time the twelfth signal S12 toggles. Further, a comparator 563 compares the output of the flip-flop 561 with the first bit N<0> (e.g., the least significant bit) of the path information N<0:2>, and when the two values are different, enables the second phase signal CMPOUT2 to a logic high level. Alternatively, when the two values are the same, the comparator 563 maintains the second phase signal CMPOUT2 at the logic low level. Therefore, in the case of FIG. 9, since the value of the path information N<0:2> is 1, the least significant bit N<0> of the path information N<0:2> is in a logic high level, and since the output of the flip-flop 561 becomes a logic low level, the second phase signal CMPOUT2 is enabled to a logic high level. Here, the first phase signal CMPOUT1 is disabled to a logic low level.

Additionally, when the second phase signal CMPOUT2 is enabled to a logic high level, the calculator 520 of the delay amount deciding unit 403 obtains a value for the latency delay amount LSHIFT<0:3> by subtracting the path information N<0:2> from the latency value LA of the input signal INPUT.

Therefore, as shown in FIG. 10, when the latency delay amount LSHIFT<0:3> represents 2 clock cycles, the latency signal LATC may be generated after two clock cycles of the external clock EXTCLK by delaying the input signal INPUT by a number of clock cycles equal to the value of the latency delay amount LSHIFT<0:3> (i.e., delaying the input signal INPUT by two clock cycles because LSHIFT<0:3>=2), further delaying the delayed signal by the second delay amount DLY2, and synchronizing the resultant delayed signal to a rising edge of the internal clock DLLCLK. In this way, it is possible to prevent a failure shown in FIG. 3B from occurring.

Accordingly, the latency delay unit 405 generates the latency signal LATC by delaying the input signal INPUT, which is synchronized with the external clock EXTCLK, and then, synchronizing the resultant delayed signal with the internal clock DLLCLK. However, the latency delay unit 405 may also generate the latency signal LATC by delaying the input signal INPUT, synchronizing the resultant delayed signal with the internal clock DLLCLK, and then again delaying the synchronized signal by the latency delay amount LSHIFT<0:3> from the internal clock DLLCLK.

The latency control circuit according to an exemplary embodiment of the present invention may be used as an output enable signal generation circuit for a semiconductor memory device, such as Double Data Rate Synchronous Dynamic Random Access Memory (DDR SDRAM). In this case, the input signal INPUT is a write signal or a read signal for storing or reading a data in a memory device, and the latency of the input signal INPUT may be a CAS write latency (CWL) or a CAS latency (CL). Also, the latency signal LATC may be an output enable (OE) signal, which is transferred to a data input/output circuit inside of the semiconductor to perform a data input/output operation corresponding to the read/write signal, CAS write latency (CWL), or a CAS latency (CL).

According to an exemplary embodiment of the present invention, a latency signal may be generated at an exact moment by generating phase information on whether the phase difference between an external clock and an internal clock is within a certain value and controlling a latency delay amount based on the phase information, even though there is a slight phase difference between the external clock and the internal clock. In short, domain crossing may be performed without a failure originating from a change in the PVT conditions of a semiconductor device.

While the present invention has been described with respect to the specific embodiments, it will be apparent to those skilled in the art that various changes and modifications may be made without departing from the spirit and scope of the invention as defined in the following claims.

What is claimed is:

1. A latency control circuit of a semiconductor device, comprising:
   a phase detection unit configured to generate phase information regarding a phase difference between an external clock and an internal clock;
   a delay amount deciding unit configured to decide a latency delay amount based on path information of an input signal, a latency value of the input signal, and the phase information; and
   a latency delay unit configured to generate a latency signal by delaying the input signal according to the latency delay amount and the phase information to produce a delayed input signal and by synchronizing the delayed input signal with the internal clock.

2. The latency control circuit of claim 1, wherein the phase information indicates whether the phase difference between the external clock and the internal clock is within a certain value.

3. The latency control circuit of claim 2, wherein the external clock and the internal clock have the same clock frequency.

4. The latency control circuit of claim 1, wherein the internal clock is generated inside the semiconductor device by delaying the external clock.

5. The latency control circuit of claim 4, wherein the internal clock is a delayed locked loop clock generated by a delayed locked loop (DLL) circuit.

6. The latency control circuit of claim 1, wherein the input signal is inputted in synchronization with the external clock.

7. The latency control circuit of claim 1, wherein the path information has a value representing a delay amount of a transfer path through which the input signal passes inside the semiconductor device.

8. The latency control circuit of claim 1, wherein the phase information comprises a first phase signal and a second phase signal, and
the phase detection unit enables the first phase signal when the external clock leads the internal clock within a first threshold value, and enables the second phase signal when the internal clock leads the external clock within a second threshold value.

9. The latency control circuit of claim 8, wherein when the first phase signal is enabled,
the delay amount deciding unit decides the latency delay amount by subtracting the sum of the value of the path information and one from the latency value, and
the latency delay unit generates the latency signal by delaying the input signal by the latency delay amount and a first delay amount to produce the delayed input signal and synchronizes the delayed input signal with the internal clock.

10. The latency control circuit of claim 9, wherein the first delay amount is the same or greater than the first threshold value.

11. The latency control circuit of claim 8, wherein when the second phase signal is enabled,
the delay amount deciding unit decides the latency delay amount by subtracting the path information from the latency value, and
the latency delay unit generates the latency signal by delaying the input signal by the latency delay amount and a second delay amount to produce the delayed input signal and synchronizes the delayed input signal with the internal clock.

12. The latency control circuit of claim 11, wherein the second delay amount is the same or greater than the second threshold value.

13. The latency control circuit of claim 8, wherein when the first phase signal and the second phase signal are disabled,
the delay amount deciding unit decides the latency delay amount by subtracting the path information from the latency value, and
the latency delay unit generates the latency signal by delaying the input signal by the latency delay amount to produce the delayed input signal and synchronizes the delayed input signal with the internal clock.

14. The latency control circuit of claim 1, wherein the delay amount deciding unit comprises:
a path information generator for generating the path information in response to a delay amount reset signal which is inputted in synchronization with the external clock; and
a calculator for receiving the latency value, the path information, and the phase information and deciding the latency delay amount.

15. A semiconductor memory device, comprising:
a delay locked loop unit configured to generate an internal clock by delaying an external clock;
a phase detection unit configured to generate phase information regarding a phase difference between the external clock and the internal clock;
a delay amount deciding unit configured to decide a latency delay amount based on path information of an input signal, a latency value of the input signal, and the phase information;
a latency delay unit configured to generate a latency signal by delaying the input signal according to the latency delay amount and the phase information to produce a delayed input signal and by synchronizing the delayed input signal with the internal clock; and
a data input/output unit configured to perform a data input/output operation in response to the latency signal.

16. The semiconductor memory device of claim 15, wherein the input signal is a write signal, and the latency value of the input signal is a CAS write latency (CWL).

17. The semiconductor memory device of claim 15, wherein the input signal is a read signal, and the latency value of the input signal is a CAS latency (CL).

18. The semiconductor memory device of claim 15, wherein the path information has a value representing a delay amount of the input signal until the input signal is transferred to the data input/output unit.

19. The semiconductor memory device of claim 15, wherein the phase information comprises a first phase signal and a second phase signal, and
the phase detection unit enables the first phase signal when the external clock leads the internal clock within a first threshold value, and enables the second phase signal when the internal clock leads the external clock within a second threshold value.

20. The semiconductor memory device of claim 19, wherein when the first phase signal is enabled,
the delay amount deciding unit decides the latency delay amount by subtracting the sum of the value of the path information and one from the latency value, and
the latency delay unit generates the latency signal by delaying the input signal by the latency delay amount and a first delay amount to produce the delayed input signal and synchronizes the delayed input signal with the internal clock.

21. The semiconductor memory device of claim 20, wherein the first delay amount is the same or greater than the first threshold value.

22. The semiconductor memory device of claim 19, wherein when the second phase signal is enabled,
the delay amount deciding unit decides the latency delay amount by subtracting the path information from the latency value, and
the latency delay unit generates the latency signal by delaying the input signal by the latency delay amount and a second delay amount to produce the delayed input signal and synchronizes the delayed input signal with the internal clock.

23. The semiconductor memory device of claim 22, wherein the second delay amount is the same or greater than the second threshold value.

24. The semiconductor memory device of claim 19, wherein when the first phase signal and the second phase signal are disabled,
the delay amount deciding unit decides the latency delay amount by subtracting the path information from the latency value, and
the latency delay unit generates the latency signal by delaying the input signal by the latency delay amount to produce the delayed input signal and synchronizes the delayed input signal with the internal clock.

25. The semiconductor memory device of claim 15, wherein the delay amount deciding unit comprises:
a path information generator for generating the path information in response to a delay amount reset signal which is inputted in synchronization with the external clock; and
a calculator for receiving the latency value, the path information, and the phase information and deciding the latency delay amount.

26. A method for controlling a latency, comprising:
- generating path information of a semiconductor device in response to a delay amount reset signal;
- generating phase information regarding a phase difference between an external clock and an internal clock;
- deciding a latency delay amount based on a latency value of an input signal, the path information, and the phase information;
- delaying the input signal according to the latency delay amount and the phase information to produce a delayed input signal; and
- generating a latency signal by synchronizing the delayed input signal with the internal clock.

27. The method of claim 26, wherein the generating of the phase information comprises detecting whether the phase difference between the external clock and the internal clock is within a certain value.

28. The method of claim 26, wherein the internal clock is generated inside the semiconductor device based on the external clock.

29. The method of claim 26, wherein the path information has a value representing a delay amount of a transfer path through which the input signal passes inside the semiconductor device.

30. The method of claim 26,
- wherein the deciding of the latency delay amount comprises subtracting the sum of the value of the path information and one from the latency value and setting the result as the latency delay amount, and
- wherein the delaying of the input signal comprises delaying the input signal by the latency delay amount and a first delay amount to produce the delayed input signal,
- when the external clock leads the internal clock within a first threshold value.

31. The method of claim 30, wherein the first delay amount is the same or greater than the first threshold value.

32. The method of claim 26,
- wherein the deciding of the latency delay amount comprises subtracting the path information from the latency value and setting the result as the latency delay amount, and
- wherein the delaying of the input signal comprises delaying the input signal by the latency delay amount and a second delay amount to produce the delayed input signal,
- when the internal clock leads the external clock within a second threshold value.

33. The method of claim 32, wherein the second delay amount is the same or greater than the second threshold value.

* * * * *